(12) United States Patent  
Itamoto

(10) Patent No.: US 7,813,649 B2
(45) Date of Patent: Oct. 12, 2010

(54) OPTICAL MODULE

(75) Inventor: Hiromitsu Itamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 518 days.

(21) Appl. No.: 11/871,205

(22) Filed: Oct. 12, 2007

(65) Prior Publication Data

US 2008/0118251 A1 May 22, 2008

(30) Foreign Application Priority Data

Nov. 21, 2006 (JP) .............................. 2006-314563

(51) Int. Cl.
*H04B 10/00* (2006.01)
*G02B 6/12* (2006.01)

(52) U.S. Cl. ........................... 398/164; 398/182; 385/14

(58) Field of Classification Search ................. 398/164, 398/182; 333/32; 385/14, 92

See application file for complete search history.

(56) References Cited

U.S. PATENT DOCUMENTS 7,071,491 B2 * 7/2006 Baek et al. ..................... 257/81
2007/0181792 A1 * 8/2007 Yoshimoto et al. .......... 250/239

FOREIGN PATENT DOCUMENTS

| EP | 0 893 861 A2 | 1/1999 |
| JP | 4-365381 | 12/1992 |
| JP | 2004-319984 | 11/2004 |

* cited by examiner

*Primary Examiner*—M. R. Sedighian
(74) *Attorney, Agent, or Firm*—Leydig, Voit & Mayer, Ltd.

(57) ABSTRACT

An optical module includes a stem with a piercing hole, an optical element mounted on a top surface of the stem, a lead which passes through the piercing hole, one end of the lead being connected to the optical element, and an insulating material in the piercing hole and insulating the stem from the lead. An opening of the piercing hole on the top surface of the stem is smaller than an opening of the piercing hole on an underside of the stem.

5 Claims, 1 Drawing Sheet

OPTICAL MODULE

BACKGROUND OF THE INVENTION

1. Field of the Invention

The present invention relates to an optical module used for optical communication, and more particularly, to an optical module which can increase a mounting area on a stem and compensate for impedance.

2. Background Art

In recent years, an optical transmission system of 10 Gbps is becoming commercially practical and research and development thereof is underway in every place. An optical module which builds such an optical transmission system achieves impedance matching by adjusting the diameter of a lead which passes through a stem (e.g., see Japanese Patent Laid-Open No. 4-365381 or Japanese Patent Laid-Open No. 2004-319984).

To secure a mounting area on a stem, a conventional optical module adopts a glass sealing section of the stem with a hole having a small diameter. This involves a problem that the glass sealing section has impedance of 20 to 30Ω, not an ideal value of 50Ω, resulting in an impedance mismatch.

SUMMARY OF THE INVENTION

The present invention has been implemented to solve the above described problem and it is an object of the present invention to provide an optical module capable of increasing the mounting area on the stem and compensating for impedance.

The optical module according to the present invention includes a stem provided with a piercing hole, an optical element mounted on a top surface of the stem, a lead which passes through the piercing hole, one end of which is connected to the optical element and an insulating material charged into the piercing hole for insulating the stem from the lead, wherein an opening of the piercing hole on the top surface of the stem is smaller than an opening of the piercing hole on an underside of the stem.

The present invention can increase the mounting area on the stem and compensate for impedance.

Other and further objects, features and advantages of the invention will appear more fully from the following description.

DETAILED DESCRIPTION OF THE PREFERRED EMBODIMENTS

First Embodiment

Figure 1:
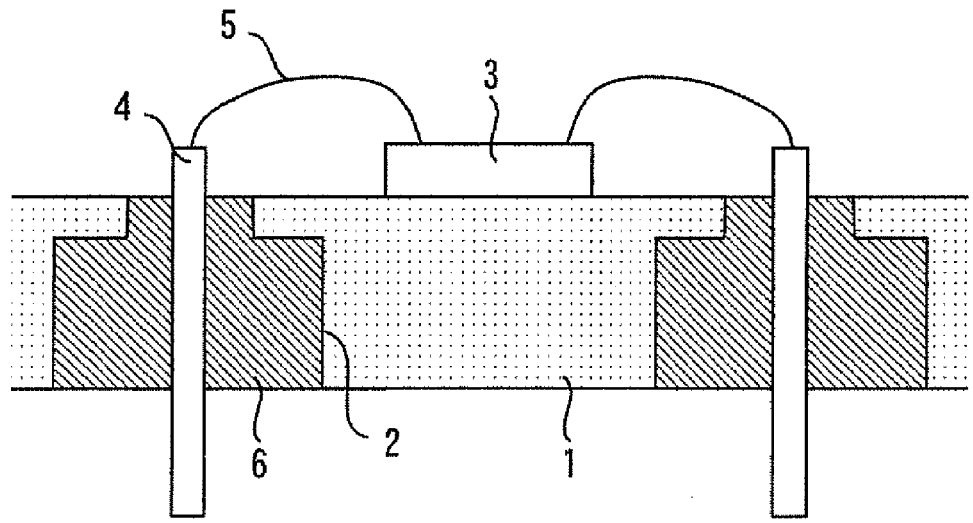
FIG. 1 is a cross-sectional view of an optical module according to First Embodiment of the present invention.

FIG. 1 is a cross-sectional view of an optical module according to First Embodiment of the present invention. A piercing hole 2 is provided in a stem 1 made of metal. A preamplifier IC 3 which is an optical element is mounted on the top surface of the stem 1 by means of soldering. A lead 4 passes through the piercing hole 2. One end of the lead 4 is connected with the preamplifier IC 3 through a gold wire 5. Furthermore, the piercing hole 2 is filled with glass 6 which is an insulating material insulating the stem 1 from the lead 4.

The piercing hole 2 has a stepped shape and one opening of the piercing hole 2 on the top surface of the stem 1 is smaller than the other opening of the piercing hole 2 on the underside of the stem 1. In this way, it is possible to increase the mounting area on the stem 1 by reducing the size of the opening of the piercing hole 2 on the top surface of the stem 1. Furthermore, since the piercing hole 2 on the underside of the stem 1 can be widened, it is possible to compensate for impedance.

Second Embodiment

Figure 2:
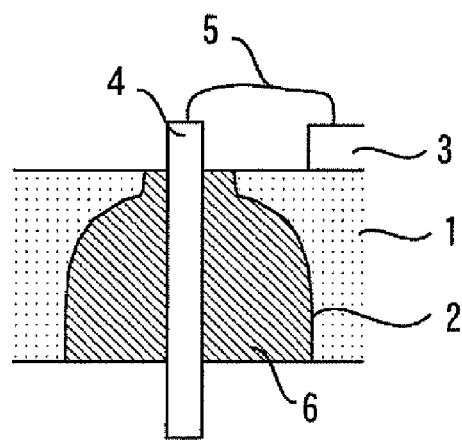
FIG. 2 is a cross-sectional view showing main parts of an optical module according to Second Embodiment of the present invention.

FIG. 2 is a cross-sectional view showing main parts of an optical module according to Second Embodiment of the present invention. In this Second Embodiment, a piercing hole 2 has a tapered shape and one opening of the piercing hole 2 on the top surface of the stem 1 is smaller than the other opening of the piercing hole 2 on the underside of the stem 1. The rest of the configuration is the same as that of First Embodiment. Therefore, this embodiment has the same effect as that of First Embodiment.

Third Embodiment

Figure 3:
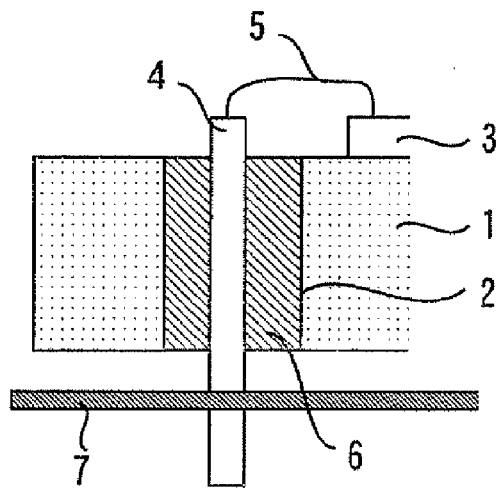
FIG. 3 is a cross-sectional view showing main parts of an optical module according to Third Embodiment of the present invention.

FIG. 3 is a cross-sectional view showing main parts of an optical module according to Third Embodiment of the present invention. In this Third Embodiment, a flexible substrate 7 is further provided which is connected to the other end of a lead 4 by means of soldering and the underside of a stem 1 is separated from the flexible substrate 7. Furthermore, a piercing hole 2 has a general rectilinear shape. The rest of the configuration is the same as that of First Embodiment.

Separating the stem 1 from the flexible substrate 7 in this way can constitute a capacitative component, and can thereby compensate for impedance. Furthermore, narrowing the opening of the piercing hole 2 can increase the mounting area on the stem 1. Combining the configuration of this Third Embodiment and the configuration of First Embodiment or 2 allows the module to further increase the effectiveness thereof.

The entire disclosure of a Japanese Patent Application No. 2006-314563, filed on Nov. 21, 2006 including specification, claims, drawings and summary, on which the Convention priority of the present application is based, are incorporated herein by reference in its entirety.

What is claimed is:

1. An optical module comprising:
    a stem including opposed top and bottom surfaces and a piercing hole, the piercing hole penetrating the stem from the bottom surface to the top surface;
    an optical element mounted on the top surface of the stem;
    a lead passing through the piercing hole, the lead having a first end projecting from the top surface of the stem and a second end projecting from the bottom surface of the stem;
    a wire electrically connecting the first end of the lead to the optical element; and
    an electrically insulating material filling the piercing hole, contacting the stem and the lead intermediate the first and second ends of the lead, and electrically insulating the stem from the lead, wherein
        the piercing hole has a first area on the top surface of the stem and a second area on the bottom surface of the stem, and
        the first area is smaller than the second area.

2. The optical module according to claim 1, wherein the area of the piercing hole changes abruptly from the first area to the second area at a location in the stem between the bottom surface and the top surface.

3. The optical module according to claim 1, wherein the area of the piercing hole changes gradually from the first area to the second area at a location between the bottom surface and the top surface.

4. The optical module according to claim 1, wherein the area of the piercing hole changes gradually from the second area at the bottom surface of the stem to the first area at an intermediate position between the bottom surface and the top surface of the stem and is uniform in area from the intermediate position to the top surface of the stem.

5. An optical module comprising:
- a stem including opposed top and bottom surfaces and a piercing hole, the piercing hole penetrating the stem from the bottom surface to the top surface;
- an optical element mounted on the top surface of the stem;
- a lead passing through the piercing hole, the lead having a first end projecting from the top surface of the stem and a second end projecting from the bottom surface of the stem;
- a wire electrically connecting the first end of the lead to the optical element;
- an electrically insulating material filling the piercing hole, contacting the stem and the lead intermediate the first and second ends of the lead, and electrically insulating the stem from the lead; and
- a flexible substrate mounted on the lead between the bottom surface of the stem and the second end of the lead, spaced from the bottom surface of the stem and the second end of the lead.

* * * * *